(12) United States Patent
Kimura (10) Patent No.: US 8,778,217 B2
(45) Date of Patent: Jul. 15, 2014

(54) POLISHING SLURRY FOR CMP, AND POLISHING METHOD

(75) Inventor: Tadahiro Kimura, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 419 days.

(21) Appl. No.: 12/307,440

(22) PCT Filed: Jul. 4, 2007

(86) PCT No.: PCT/JP2007/063369
§ 371 (c)(1),
(2), (4) Date: Jan. 5, 2009

(87) PCT Pub. No.: WO2008/004579
PCT Pub. Date: Jan. 10, 2008

(65) Prior Publication Data
US 2009/0209104 A1    Aug. 20, 2009

(30) Foreign Application Priority Data

Jul. 5, 2006    (JP) ................ P2006-185471

(51) Int. Cl.
*C09K 13/06*    (2006.01)

(52) U.S. Cl.
USPC ........ 252/79.4; 252/79.1; 252/79.2; 438/693; 216/89

(58) Field of Classification Search
USPC .................. 438/691, 692, 693, 747, 754; 216/88.89, 89, 90, 88; 252/79.1, 79.2, 252/79.3, 79.4
See application file for complete search history.

(56) References Cited

U.S. PATENT DOCUMENTS

| 4,944,836 | A | 7/1990 | Beyer et al. |
| 7,442,675 | B2 * | 10/2008 | Yokoi et al. ............ 510/175 |

(Continued)

FOREIGN PATENT DOCUMENTS

| CN | 1683487 | 10/2005 |
| EP | 1505639 | 2/2005 |

(Continued)

OTHER PUBLICATIONS

Korean Official Action dated Jan. 17, 2011, for KR Application No. 10-2009-7000069.

(Continued)

*Primary Examiner* — Lan Vinh
(74) *Attorney, Agent, or Firm* — Antonelli, Terry, Stout & Kraus, LLP.

(57) ABSTRACT

Disclosed is a polishing slurry for CMP which makes it possible to polish a barrier layer, a wiring metal layer and an interlayer dielectric continuously, and restrain a phenomenon that the interlayer dielectric in a region near the wiring metal layer is excessively shaven off so that a depression is generated. A polishing slurry, for CMP, containing abrasive particles, an acid, a tolyltriazole compound represented by the following general formula (I), and water:

$$\text{(I)}$$

wherein $R^1$s each independently represent an alkylene group having 1 to 4 carbon atoms, and $R^2$ represents an alkylene group having 1 to 4 carbon atoms.

18 Claims, 3 Drawing Sheets

(56) References Cited

U.S. PATENT DOCUMENTS

| | | | |
|---|---|---|---|
| 2002/0132560 A1* | 9/2002 | Luo et al. | 451/36 |
| 2002/0155702 A1* | 10/2002 | Aoki et al. | 438/653 |
| 2003/0099908 A1 | 5/2003 | Yokoi et al. | |
| 2003/0176068 A1* | 9/2003 | Small et al. | 438/690 |
| 2005/0090104 A1* | 4/2005 | Yang et al. | 438/689 |
| 2005/0176259 A1 | 8/2005 | Yokoi et al. | |
| 2005/0187118 A1 | 8/2005 | Haraguchi et al. | |
| 2005/0194565 A1* | 9/2005 | Kamiya et al. | 252/79.1 |
| 2006/0075688 A1* | 4/2006 | Takenouchi | 51/307 |
| 2006/0110690 A1 | 5/2006 | Haraguchi et al. | |
| 2006/0163206 A1* | 7/2006 | Belov et al. | 216/88 |
| 2007/0196975 A1 | 8/2007 | Nomura et al. | |

FOREIGN PATENT DOCUMENTS

| | | |
|---|---|---|
| JP | 02-278822 | 11/1990 |
| JP | 08-083780 | 3/1996 |
| JP | 2003-076037 | 3/2003 |
| JP | 2004-029696 | 1/2004 |
| JP | 2004-273790 | 9/2004 |
| JP | 2005-209953 | 8/2005 |
| JP | 2005-235901 | 9/2005 |
| JP | 2006-106616 | 4/2006 |
| KR | 10-2005-0006191 | 1/2005 |
| KR | 10-2005-0006203 | 1/2005 |
| TW | 563005 | 11/2003 |
| TW | 200537615 | 11/2005 |
| TW | I303660 | 12/2008 |

OTHER PUBLICATIONS

Translation of the Preliminary Report on Patentability dated Jan. 29, 2009, for Application No. PCT/JP2007/063369, filed Jul. 4, 2007.
Chinese Official Action issued on Mar. 11, 2010, for Application No. 2007800253412.
Chinese Official Action issued on Sep. 10, 2010, for Application No. 200780025341.2.
Japanese Official Action dated Aug. 30, 2011, for JP Application No. 2008-523710.
Korean Official Action dated Sep. 26, 2011, for KR Application No. 10-2009-7000069.
Taiwanese Official Action dated Jul. 29, 2011, for TW Application No. 096124471.
Taiwanese Official Action issued Aug. 31, 2012, in TW Application No. 10120917380.
Korean Official Action dated Oct. 30, 2012, for KR Application No. 10-2011-7030577.
Korean Official Action dated Mar. 5, 2012, for KR Application No. 10-2011-7030577.
Taiwanese Official Action dated Mar. 12, 2013, for TW Application No. 096124471.
Korean Official Action dated May 31, 2013, for KR Application No. 10-2013-7005350.
Kaufman et al., "Chemical-Mechanical Polishing for Fabricating Patterned W Metal Features as Chip Interconnects", J. Electrochem Soc., vol. 138, No. 11, Nov. 1991, pp. 3460-3465.

* cited by examiner

POLISHING SLURRY FOR CMP, AND POLISHING METHOD

TECHNICAL FIELD

The present invention relates to a polishing slurry for CMP, and a polishing method.

BACKGROUND ART

In recent years, new finely working techniques have been developed as the integration degree and the performance of semiconductor integrated circuits (abbreviated to LSIs hereinafter) have been improved. Chemical mechanical polishing (referred to as CMP hereinafter) is one of the techniques, and is frequently used in LSI-producing processes, in particular, for making interlayer dielectrics flat, forming metal plugs, forming embedded wiring, and attaining others in the step of forming multilayer interconnection. This technique is disclosed in, for example, the specification of U.S. Pat. No. 4,944,836.

In order to make the performance of LSIs high, the use of copper alloy as a wiring material has recently been started instead of that of conventional aluminum alloy. However, copper alloy does not easily undergo fine working based on dry etching, which is used to form aluminum alloy wiring. Thus, the following process (the so-called damascene process) is mainly adopted: a method of depositing a thin film of a copper alloy on an interlayer dielectric in which trenches are beforehand made, so as to embed the film therein, and then removing the copper alloy thin film other than the thin film in the concave regions by CMP, thereby forming embedded wiring. The damascene process is disclosed in, for example, Japanese Patent Application Laid-Open No. 02-278822.

Before depositing a thin film of a copper alloy on an interlayer dielectric in which trenches are beforehand made, so as to embed the film therein, a barrier layer made of a barrier metal such as TaN or Ta is formed, on the interlayer dielectric, in order to prevent the copper alloy from diffusing into the interlayer dielectric, or to keep adhesive force between the copper alloy and the interlayer dielectric.

An ordinary method for making a metal such as copper alloy flat by CMP is a method of causing a polishing pad to attach onto a circular polishing table (platen), making the surface of the polishing pad wet by a polishing slurry for metal, pushing a surface of a base substance on which the metal film is formed onto the surface of the polishing pad, and rotating the polishing table in the state that a predetermined pressure (referred to as a polishing pressure hereinafter) is applied from the rear surface of the polishing pad to the metal film, thereby removing convex regions of the metal film by mechanical friction between the polishing slurry and the convex regions of the metal film.

The metal polishing slurry used in CMP is usually composed of solid abrasive particles, an oxidizer, and water. It appears that the metal film surface is first oxidized with the oxidizer to form an oxidized layer and then the oxidized layer is shaven off with the solid abrasive particles. The oxidized layer on the metal film surface in concave regions does not contact the polishing pad much, so that the shaving-off effect based on the solid abrasive particles is not produced thereon. Accordingly, with the advance of the CMP, the oxidized layer on the convex regions of the metal film is removed so that the base substance surface is made flat (see Journal of Electrochemical Society, vol. 138, No. 11, published in 1991, pp. 3460-3464).

As a method for improving the polishing rate in CMP, known is a method of incorporating an oxidized metal solubilizing agent into a metal polishing slurry (Japanese Patent Application Laid-Open No. 08-83780). It is stated that when a metal oxide shaven off with solid abrasive particles are dissolved by effect of the oxidized metal solubilizing agent, the shaving-off effect based on the abrasive particles are increased. The polishing rate based on CMP is improved by the incorporation of the oxidized metal solubilizing agent; however, when an oxidized layer on a metal film surface in concave regions is also dissolved (etched) so that the metal film surface is exposed, the metal film surface is further oxidized with the oxidizer. When this is repeated, the etching of the metal film in the concave regions advances so that the flattening effect is damaged. In order to prevent this, an etching inhibitor (protective film forming agent) such as benzotriazole is further added to the metal polishing slurry (Japanese Patent Application Laid-Open No. 08-83780). The protective film forming agent is an agent for forming a protective film on the oxidized layer on the metal film surface to prevent the oxidized layer from being etched.

Figure 1:
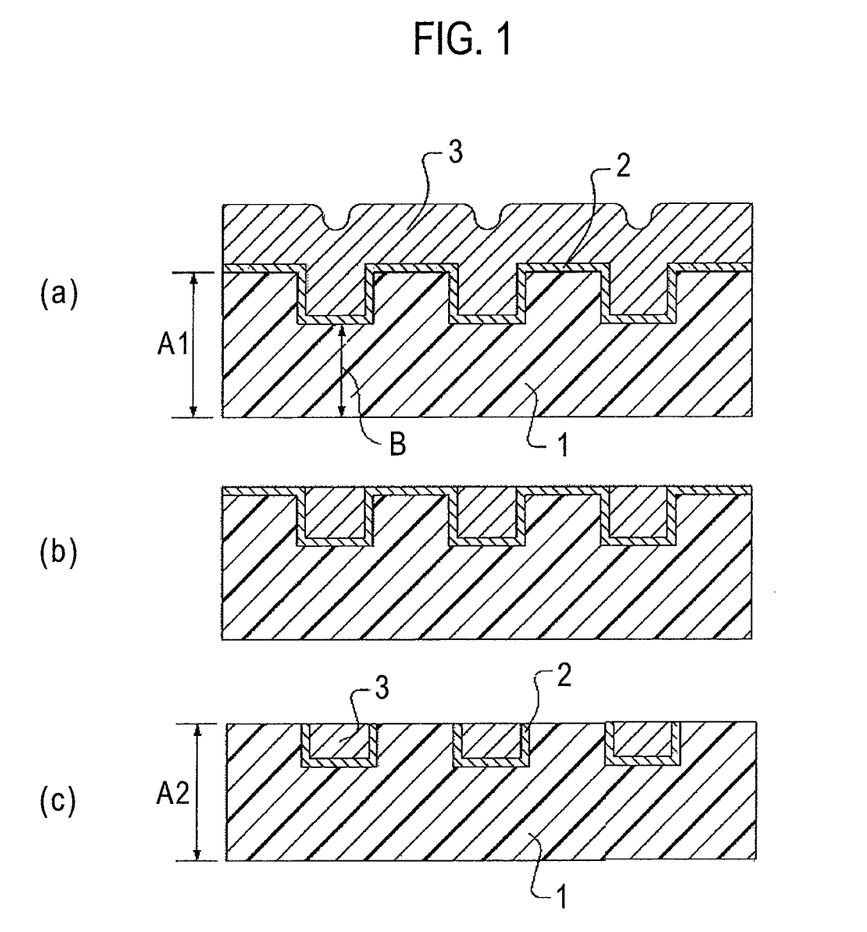
FIGS. 1(a) to 1(c) are schematic sectional views illustrating an example of a polishing step.

FIG. 1 illustrates an example of the step of making an LSI flat. In FIG. 1(a), concave regions having a thickness B and convex regions having a thickness A1 are formed in a surface of an interlayer dielectric 1. A barrier layer 2 is formed, following the surface shape of the interlayer dielectric. Furthermore, a wiring metal layer 3 of copper, a copper alloy or the like is formed thereon. When the width of the concave regions is somewhat large, concave regions are made in the wiring metal surface, as illustrated in FIG. 1(a).

The wiring metal layer 3 other than the layer 3 in the concave regions is first removed with a polishing slurry for CMP. As illustrated in FIG. 1(b), at this time, the wiring metal layer 3 on the convex regions may be completely removed. The polishing may also be performed so as to leave the wiring metal layer 3 in a small amount.

Next, polishing slurry for barrier metal CMP is used to polish and remove the barrier layer 2 made of the barrier metal such as TaN or Ta. As illustrated in FIG. 1(c), at this time, a small amount of the interlayer dielectric 1 is polished in order to remove residues of the barrier layer 2 that may be present on the convex regions of the interlayer dielectric 1. Accordingly, the relationship between the thickness A2 of the interlayer dielectric 1 after the polishing and the thickness A1 of the interlayer dielectric before the polishing of the barrier layer is as follows: A1>A2.

Most popularly, the wiring metal layer 3 is copper or copper alloy, the interlayer dielectric 1 is $SiO_2$, and the barrier layer 2 is a tantalum based metal such as Ta or TaN in FIG. 1. However, when the interlayer dielectric 1 is polished as described above in order to remove residues of the barrier layer 2 present on the convex regions of the interlayer dielectric 1, the interlayer dielectric 1 in a region near the wiring metal layer 3 is more largely shaven off than the interlayer dielectric 1 in other regions. Thus, there is easily caused a problem that a depression is generated. Such a depression is called a fang or seam.

Figure 2:
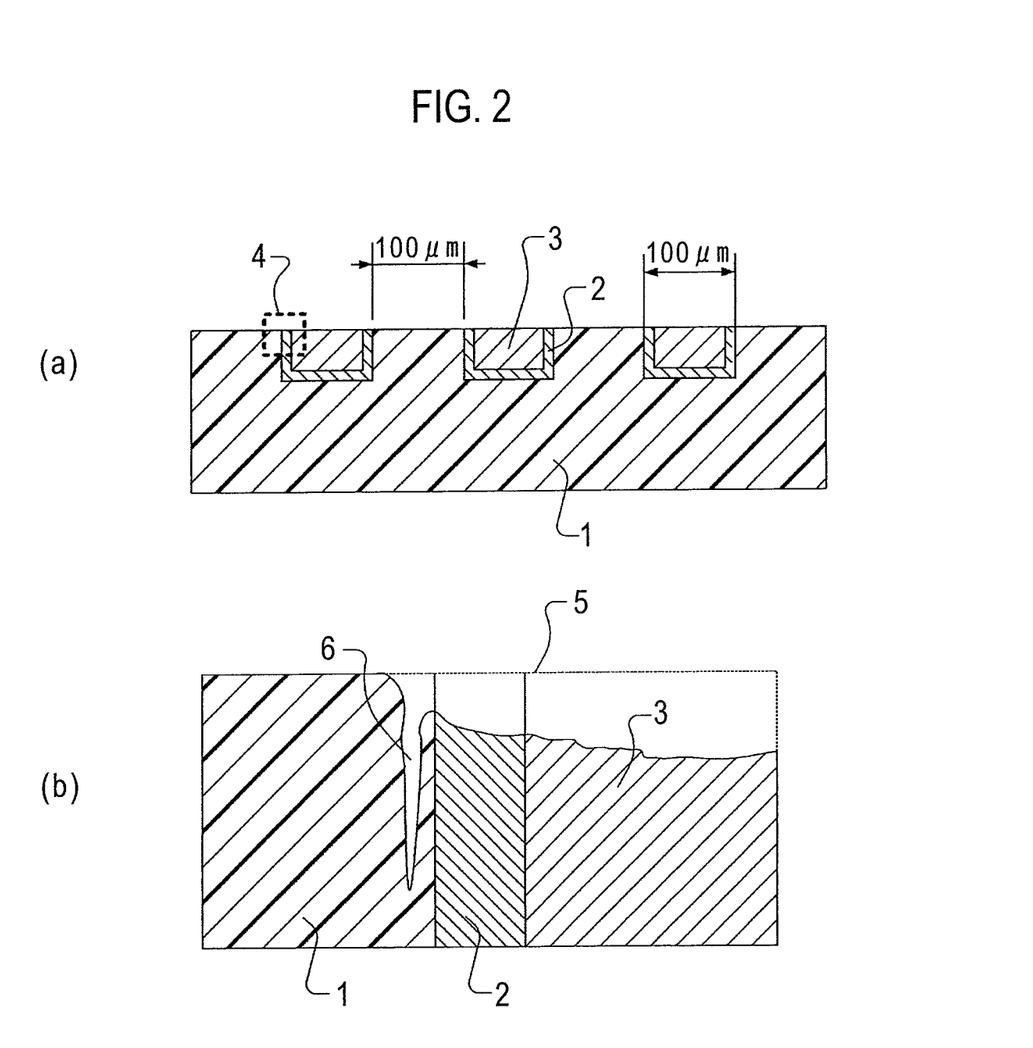
FIGS. 2(a) and 2(b) are schematic sectional views illustrating a seam in a wired substrate wherein lines and spaces are 100 μm and 100 μm in width, respectively.

FIG. 2(a) is a schematic sectional view of a wired substrate wherein lines and spaces are 100 μm and 100 μm, respectively, in width. FIG. 2(b) is an enlarged schematic view of a portion surrounded by a dot line 4 in FIG. 2(a). An ideal state after the polishing, or a case where the barrier layer 2 present on the convex regions of the interlayer dielectric 1 is completely removed so that the film can be polished into a flat form, is represented by a dot line 5 in FIG. 2(b). In general, however, such ideal polishing is difficult; usually, as illustrated in FIG. 2(b), the wiring metal layer 3 or the barrier layer 2 is somewhat excessively polished. Such somewhat excessive polishing in the wiring metal layer 3 or the barrier layer 2 does not usually become a serious problem. In accordance with the polishing property of the polishing slurry for CMP, a depression, i.e., what is called a seam 6 may be generated near the side of the wiring metal layer 3 or near an interface between the interlayer dielectric 1 and the barrier layer 2.

Figure 3:
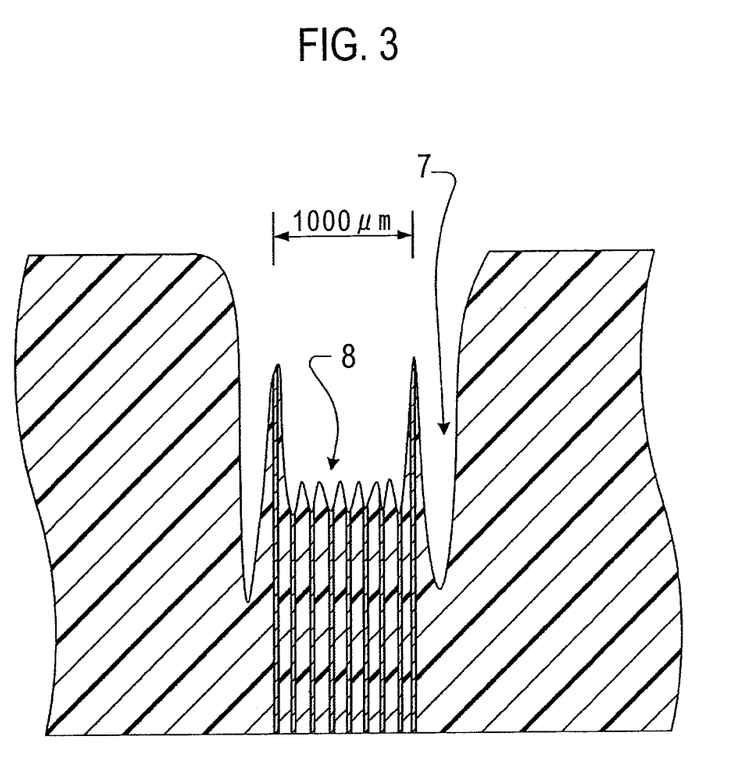
FIG. 3 is a schematic sectional view illustrating a fang in a wired substrate having a fine wiring region 9 μm/1 μm in width.

FIG. 3 is a schematic sectional view of a wired substrate having a fine wiring region 8, 1000 μm in total width, wherein wiring metal regions, having a width of 9 μm, are arranged to be alternated with interlayer dielectric regions, having a width of 1 μm. A depression, i.e., what is called a fang 7 may be generated near a boundary between the fine wiring region 8, wherein the density of the wiring metal regions is high, and a field region alongside the region 8.

When substrates are laminated onto each other, the upper substrate thereof follows a depression, such as a fang or seam, in the lower substrate; thus, the depression produces a bad effect on attainment of flattening the upper substrate. As the case may be, the depression causes a short circuit in wiring, so as to result in a fall in the production yield of LSIs.

An object of the invention is to provide a polishing slurry for CMP which makes it possible to polish a barrier layer made of a barrier metal such as TaN or Ta, a wiring metal layer and an interlayer dielectric continuously, and restrain, at this time, a phenomenon that the interlayer dielectric in a region near the wiring metal layer is more largely shaved than the interlayer dielectric in other regions so that a depression is generated.

DISCLOSURE OF THE INVENTION

The invention relates to (1) a polishing slurry for CMP, containing abrasive particles, an acid, a tolyltriazole compound represented by the following general formula (I), and water:

[Formula 1]

(I)

In the formula (I), $R^1$s each independently represent an alkylene group having 1 to 4 carbon atoms, and $R^2$ represents an alkylene group having 1 to 4 carbon atoms.

The invention also relates to (2) the polishing slurry for CMP according to the above-mentioned (1) wherein $R^2$ in the general formula (I) is a methylene group.

The invention also relates to (3) the polishing slurry for CMP according to the above-mentioned (1) wherein $R^1$s in the general formula (I) are each a methylene group or an ethylene group.

The invention also relates to (4) the polishing slurry for CMP according to the above-mentioned (1) wherein the tolyltriazole compound is 2,2'-((4-methyl-1H-benzotriazole-1-yl)methyl imino) bisethanol, 2,2'-((5-methyl-1H-benzotriazole-1-yl)methyl imino) bisethanol, or a mixture thereof.

The invention also relates to (5) the polishing slurry for CMP according to the above-mentioned (1) wherein the difference (absolute value) between the zeta-potential of Cu and that of TaN in the polishing slurry for CMP is 20.0 mV or less.

The invention also relates to (6) the polishing slurry for CMP according to the above-mentioned (1) which has a pH of 2 to 5.

The invention also relates to (7) the polishing slurry for CMP according to the above-mentioned (1) wherein the abrasive particles are colloidal silica.

The invention also relates to (8) the polishing slurry for CMP according to any one of the above-mentioned (1) to (7) which contains an oxidizer for metal.

The invention also relates to (9) a polishing method, comprising a first chemical mechanical polishing step of preparing a substrate having an interlayer dielectric having a surface composed of concave regions and convex regions, a barrier layer for covering the interlayer dielectric along the surface thereof, and a wiring metal layer which is filled into the concave regions to cover the barrier layer, and polishing the wiring metal layer to expose the barrier layer on the convex regions, and a second chemical mechanical polishing step of polishing the barrier layer of the substrate exposed in the first chemical mechanical polishing step using a polishing slurry for CMP as recited in any one of the above-mentioned (1) to (8), thereby exposing the interlayer dielectric on the convex regions.

The invention also relates to (10) the polishing method according to the above-mentioned (9) wherein the interlayer dielectric is a silicon-based coating film.

The invention also relates to (11) the polishing method according to the above-mentioned (9) or (10) wherein wiring metal is at least one selected from copper, copper alloy, oxides of copper, and oxides of copper alloy.

The invention also relates to (12) the polishing method according to any one of the above-mentioned (9) to (11) wherein the barrier layer comprises a tantalum or a tantalum compound.

The use of the polishing slurry of the present invention for CMP makes it possible to polish a barrier layer made of a barrier metal such as TaN or Ta, a wiring metal layer and an interlayer dielectric continuously, and prevent the interlayer dielectric in a region near the wiring metal layer from being excessively polished so as to restrain the generation of a depression, such as a fang or a seam.

BEST MODE FOR CARRYING OUT THE INVENTION

The polishing slurry of the present invention for CMP makes it possible to polish different materials, such as a metal used in wiring, an interlayer dielectric and a barrier metal, unselectively. Such a polishing slurry for CMP is called unselective barrier metal slurry.

The polishing slurry of the present invention for CMP contains abrasive particles, an acid, a tolyltriazole compound represented by the following general formula (I), and water:

[Formula 2]

(I)

In the formula (I), R¹s each independently represent an alkylene group having 1 to 4 carbon atoms, and R² represents an alkylene group having 1 to 4 carbon atoms.

Examples of the abrasive particles used in the present invention include inorganic polishing abrasive particles made of silica, alumina, zirconia, ceria, titania, germania, or silicon carbide; and organic polishing abrasive particles made of polystyrene, polyacryl, or polyvinyl chloride. Of these materials, preferred are silica, alumina, zirconia, ceria, titania, and germania, and more preferred are silica and alumina. Silica is particularly preferred. Of species of silica, preferred is colloidal silica since the dispersion stability in the polishing slurry for CMP is good and the generation number of scratches generated by CMP is small. Preferred is colloidal silica wherein the average particle diameter of secondary particle diameters is 150 nm or less. The average particle diameter is more preferably from 10 to 100 nm, more preferably from 15 to 90 nm. The above-mentioned abrasive particles may be used alone or in the form of a mixture of two or more thereof.

The zeta-potential of the abrasive particles in the polishing slurry of the present invention for CMP, in particular, the zeta-potential of silica therein is preferably 10 mV or less, more preferably 5 mV or less when the pH of the polishing slurry for CMP is from 2 to 5. If the zeta-potential of the abrasive particles are more than 10 mV, the rate of polishing an interlayer dielectric tends to be small.

Colloidal silica may be produced by a known method based on hydrolysis of a silicon alkoxide or ion exchange of sodium silicate. There is most frequently used the method of hydrolyzing a silicon alkoxide such as tetramethoxysilane or tetraethoxysilane from the viewpoint of the controllability of the particle diameter, or alkali metal impurities. Colloidal silica may also be produced by a known production method based on hydrolysis of aluminum nitrate.

The blend amount of the abrasive particles in the polishing slurry of the present invention for CMP is preferably from 0.5 to 20.0 g, more preferably form 1.0 to 15.0 g for 100 g of the polishing slurry for CMP. If the blend amount of the abrasive particles is less than 0.5 g, the rate of polishing an interlayer dielectric tends to be small and a satisfactory polishing rate may not be obtained as a property of unselective barrier metal slurry. If the blend amount of the abrasive particles is more than 20.0 g, the abrasive particles may aggregate so that the stability of the polishing slurry for CMP may deteriorate or the production costs may increase.

The acid used in the present invention may be an organic acid, an organic acid ester, an ammonium salt of an organic acid, an inorganic acid, an ammonium salt of an inorganic acid, or the like. Specific examples thereof include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and other organic acids or organic acid esters; ammonium salts of these organic acids; sulfuric acid, nitric acid, ammonium persulfate, ammonium nitrate, chlorinated ammonium, and other inorganic acids or ammonium salts of inorganic acids. Of these acids, preferred is salicylic acid, malic acid, tartaric acid, citric acid or glycolic acid since a practical polishing rate can be gained. These acids may be used alone or in the form of a mixture of two or more thereof.

The blend amount of the acid in the polishing slurry of the present invention for CMP is preferably from 0.00005 to 0.020 mol, more preferably from 0.0001 to 0.010 mol, in particular preferably from 0.0004 to 0.0075 mol for 100 g of the polishing slurry for CMP. If the blend amount of the acid is less than 0.00005 mol, a wiring metal, in particular, copper or copper alloy tends not to be easily etched. If the amount is more than 0.020 mol, the etching of a wiring metal, in particular, copper or copper alloy tends not to be easily restrained.

The polishing slurry of the present invention for CMP contains a specific tolyltriazole compound represented by the following general formula (I), whereby an interlayer dielectric in a region near a wiring metal layer can be prevented from being excessively polished, so as to restrain the generation of a depression such as a fang or seam.

[Formula 3]

(I)

In the formula (I), R¹s each independently represent an alkylene group having 1 to 4 carbon atoms, and examples thereof include methylene, ethylene, propylene, butylene, and isobutylene groups. Of these groups, preferred is a methylene or ethylene group, and more preferred is an ethylene group.

In the formula (I), R² represents an alkylene group having 1 to 4 carbon atoms, and examples thereof include the same alkylene groups as described above. Of these groups, preferred is a methylene or ethylene group, and more preferred is a methylene group.

More specifically, the tolyltriazole compound is preferably a compound represented by the following general formula (II):

[Formula 4]

(II)

In the formula (II), R¹s each represent the same alkylene group as described above. The tolyltriazole compound is more preferably a compound represented by the following general formula (III):

[Formula 5]

The tolyltriazole compound is in particular preferably 2,2'((4-methyl-1H-benzotriazole-1-yl)methylimino) bisethanol, or 2,2'((5-methyl-1H-benzotriazole-1-yl)methylimino) bisethanol. These tolyltriazole compounds may be used alone or in the form of a mixture of two or more thereof. There is preferably used a mixture of 2,2'((4-methyl-1H-benzotriazole-1-yl)methylimino) bisethanol, and 2,2'((5-methyl-1H-benzotriazole-1-yl)methylimino)bisethanol. In the mixture, the blend ratio between 2,2'((4-methyl-1H-benzotriazole-1-yl)methylimino) bisethanol and 2,2'((5-methyl-1H-benzotriazole-1-yl)methylimino) bisethanol is not particularly limited, and is appropriately selected. As a commercially available product of this mixture, the following may be used: a VERZONE TT-250A (trade name) manufactured by Daiwa Kasei K.K., or TT-LY (trade name) manufactured by Johoku Chemical Co., Ltd.

The blend amount of the tolyltriazole compound in the polishing slurry of the present invention for CMP is preferably from 0.0001 to 0.05 mol, more preferably from 0.0003 to 0.010 mol, in particular preferably from 0.0005 to 0.005 mol for 100 g of the polishing slurry for CMP. If the blend amount of the tolyltriazole compound is more than 0.05 mol, the rate of polishing a barrier metal or a wiring metal tends to fall too much. If the amount is less than 0.0001 mol, the effect of restraining the etching of a wiring metal, specifically, copper or copper alloy tends to become small.

The polishing slurry of the present invention for CMP may contain an oxidizer for metal. The metal oxidizer is not particularly limited, and examples thereof include hydrogen peroxide, nitric acid, potassium periodate, hypochlorous acid, and ozone water. Of these oxidizers, hydrogen peroxide is preferred. These may be used alone or in the form of a mixture of two or more thereof.

In a case where the base substance to which the polishing slurry of the present invention for CMP is applied is a silicon substrate containing elements for an integrated circuit, a metal oxidizer containing no nonvolatile component is preferred in order for the base substrate to avoid being polluted with an alkali metal, an alkaline earth metal, a halide, or the like. About ozone water, attention should be paid since the composition thereof is intensely changed with time. In a case where the base substance, to which the slurry is to be applied, is a glass substrate containing no semiconductor elements, the metal oxidizer may be a metal oxidizer containing a nonvolatile component.

The blend amount of the metal oxidizer in the polishing slurry of the present invention for CMP is preferably from 0.00030 to 0.0080 mole, more preferably from 0.00035 to 0.0060 mol, in particular preferably from 0.00050 to 0.0030 mol for 100 g of the polishing slurry for CMP. If the blend amount of the metal oxidizer is less than 0.00030 mol, the rate of polishing a barrier metal tends to be small. If the amount is more than 0.0080 mol, the rate of polishing an interlayer dielectric tends to become large so as to be intensely reduced. In a case where hydrogen peroxide is used as the metal oxidizer, the blend amount thereof is preferably from 0.01 to 50 g for 100 g of the polishing slurry for CMP. The timing when hydrogen peroxide is added is not particularly limited, and may be a time when the polishing slurry for CMP is used.

The polishing slurry of the present invention for CMP may contain a solvent or surfactant for improving the wettability of an interlayer dielectric.

The surfactant in the polishing slurry of the present invention for CMP is preferably a nonionic surfactant or an anionic surfactant, in particular preferably a surfactant containing no alkali metal. The surfactant is preferably at least one selected from polyethylene glycol type nonionic surfactants, glycols, glycerin aliphatic acid esters, sorbit aliphatic acid esters, aliphatic acid alkanolamides, alcohol sulphates, alkyl ether sulphates, alkylbenzene sulfonates, and alkyl phosphates.

The solvent in the polishing slurry of the present invention for CMP is not particularly limited, and is preferably a solvent miscible with water. Examples thereof include carbonates such as ethylene carbonate, propylene carbonate, dimethyl carbonate, diethyl carbonate, and methyl ethyl carbonate; lactones such as butyrolactone, and propiolactone; glycols such as ethylene glycol, propylene glycol, diethylene glycol, dipropylene glycol, triethylene glycol, and tripropylene glycol; glycol monoethers such as ethylene glycol monomethyl ether, propylene glycol monomethyl ether, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, dipropylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether, and tripropylene glycol monobutyl ether; glycol diethers such as ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether, and tripropylene glycol dibutyl ether; ethers such as tetrahydrofuran, dioxane, dimethoxyethane, polyethylene oxide, ethylene glycol monomethyl ether acetate, diethylene glycol monoethyl ether acetate, and propylene glycol monomethyl ether acetate; alcohols such as methanol, ethanol, propanol, n-butanol, n-pentanol, n-hexanol, and isopropanol; ketones such as acetone, methyl ethyl ketone; and other solvents such as phenol, dimethylformamide, n-methylpyrrolidone, ethyl acetate, ethyl lactate, and sulfolane. Of these solvents, preferred is at least one selected from glycol monoethers, alcohols, and carbonates.

The polishing slurry of the present invention for CMP may contain a water-soluble polymer having a weight-average molecular weight of 500 or more. The water-soluble polymer, which has a weight-average molecular weight of 500 or more, is not particularly limited, and examples thereof include alginic acid, pectic acid, carboxymethylcellulose, agar, curdlan, pullulan, and other polysaccharides; polyaspartic acid, polyglutamic acid, polylysine, polymalic acid, polymethacrylic acid, an ammonium salt of polymethacrylic acid, a sodium salt of polymethacrylic acid, polyamide acid, polymaleic acid, polyitaconic acid, polyfumaric acid, poly(p-styrenecarboxylic acid), polyacrylic acid, polyacrylamide, aminopolyacrylamide, an ammonium salt of polyacrylic acid, a sodium salt of polyacrylic acid, polyamide acid, an ammonium salt of polyamide acid, a sodium salt of polyamide acid, polyglyoxylic acid and other polycarboxylic acids, polycarboxylic acid esters, and salts thereof; polyvinyl alcohol, polyvinyl pyrrolidone, polyacrolein, and other vinyl polymers; and polyethylene glycol. These may be used alone or in the form of a mixture of two or more thereof. However, when a substrate to which the invention is applied is a silicon substrate for semiconductor integrated circuit, or the like, an acid or an ammonium salt thereof is desirable since it is undesired that the substrate or the like is polluted with an alkali metal, an alkaline earth metal, a halide, or the like. In a case where the base substrate is a glass substrate or the like, this matter is not applied to the case. Of the polymers, preferred are pectic acid, agar, polymalic acid, polyacrylic acid, polymethacrylic acid, an ammonium salt of polyacrylic acid, polyacrylamide, polyvinyl alcohol and polyvinyl pyrrolidone, and esters and ammonium salts thereof. The weight-average molecular weight of the water-soluble polymer may be measured by use of a calibration curve of standard polystyrene according to gel permeation chromatography.

The polishing slurry of the present invention for CMP may contain a protective film forming agent, examples of which will be given below. Examples of this protective film forming agent include compounds having a triazole skeleton, such as 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole butyl ester, 4-carboxyl(-1H-)benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, and bis[(1-benzotriazoly)methyl]phosphonic acid; compounds having a pyrazole skeleton, such as 3,5-dimethylpyrazole, 3-methyl-5-pyrazolone, 3-amino-5-methylpyrazole, 3-amino-5-hydroxypyrazole, and 3-amino-5-methylpyrazole; compounds having a pyrimidine skeleton, such as pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraminopyrimidine sulphate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetoamidepyrimidine, 2-aminopyrimidine, 2-methyl-5,7-diphenyl-(1,2,4)triazolo(1,5-a)pyrimidine, 2-methylsulphanilyl-5,7-diphenyl-(1,2,4)triazolo(1,5-a)pyrimidine, 2-methylsulphanilyl-5,7-diphenyl-4,7-dihydro-(1,2,4)triazolo (1,5-a)pyrimidine, 4-aminopyrazolo[3,4-d]pyrimidine, and 7-hydroxy-5-methyl-(2,3a)-triazolopyrimidine; compounds having an imidazole skeleton, such as imidazole, 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-aminoimidazole, and mercaptoimidazole; compounds having a guanidine skeleton, such as 1,3-diphenylguanidine, and 1-methyl-3-nitroguanidine; and compounds having a thiazole skeleton, such as 2-aminothiazole, 4,5-dimethylthiazole, 2-amino-2-thiazoline, 2,4-dimethylthiazole, and 2-amino-4-methylthiazole. These may be used alone or in the form of a mixture of two or more thereof.

When the protective film forming agent is blended with the polishing slurry of the present invention for CMP, the total amount of the protective film forming agent and the tolyltriazole compound represented by the general formula (I) is preferably from 0.0001 to 0.05 mol, more preferably from 0.0003 to 0.005 mol, in particular preferably from 0.0005 to 0.0035 mol for 100 g of the polishing slurry for CMP. If the total amount is less than 0.0001 mol, the effect of restraining the etching of a wiring metal, specifically, copper or copper alloy tends to be small. If the amount is more than 0.05 mol, the rate of polishing a barrier metal, specifically, TaN or Ta tends to be small.

The pH of the polishing slurry of the present invention for CMP is preferably from 2 to 5, more preferably from 2 to 4, in particular preferably from 2 to 3 from the viewpoint of the polishing property. If the pH is less than 2, the abrasive particles aggregate so that the storage stability of the polishing slurry for CMP may be damaged, the effect of restraining the etching of a wiring metal, specifically, copper or copper alloy may become small, or the metal may corrode. As a result, inconveniences, such as a defect in the wiring, may be generated. If the pH is more than 5, a desired polishing property may not be obtained. The pH of the polishing slurry for CMP may be adjusted into the above-mentioned range by controlling the kind of the acid or the addition amount thereof appropriately.

It is preferred that the difference (absolute value) between the zeta-potential of a wiring metal in the polishing slurry of the viewpoint invention for CMP and that of a barrier metal in the polishing slurry for CMP is small. Specifically, the difference (absolute value) between the zeta-potential of Cu in the polishing slurry for CMP and that of TaN in the polishing slurry for CMP is preferably 20.0 mV or less, more preferably from 0.0 to 19.0 mV, in particular preferably from 10 to 19 mV. If the difference (absolute value) between the zeta-potentials is more than 20 mV, a depression tends to be unable to be restrained.

The zeta-potential of a wiring metal in the polishing slurry of the viewpoint invention for CMP is preferably a negative value since an interlayer dielectric in a region near the wiring metal layer is prevented from being excessively polished and the generation of a fang or a seam can be restrained. Specifically, the zeta-potential of Cu in the polishing slurry for CMP is preferably less than 0 mV, more preferably less than −5 mV. The method for adjusting the zeta-potential of the wiring metal into the above-mentioned range is, for example, a method of adding a tolyltriazole compound represented by the general formula (I), preferably a method of adding a tolyltriazole compound such as 2,2'((4-methyl-1H-benzotriazole-1-yl)methylimino) bisethanol, or 2,2'((5-methyl-1H-benzotriazole-1-yl)methylimino) bisethanol.

The zeta-potential of a barrier metal in the polishing slurry of the viewpoint invention for CMP is preferably 19 mV or less since the difference thereof from the zeta-potential of a wiring metal can be made small. Specifically, the zeta-potential of TaN in the polishing slurry for CMP is preferably 19 mV or less, more preferably 18 mV or less. The method for adjusting the zeta-potential of the barrier metal into this range is, for example, a method of adding a tolyltriazole compound represented by the general formula (I), preferably a method of adding a tolyltriazole compound such as 2,2'((4-methyl-1H-benzotriazole-1-yl)methylimino) bisethanol, or 2,2'((5-methyl-1H-benzotriazole-1-yl)methylimino) bisethanol.

The zeta-potential of the abrasive particles in the polishing slurry of the present invention for CMP is preferably approximately 0 mV, which is an isoelectric point, in order to polish an interlayer dielectric. Specifically, the zeta-potential of silica in the polishing slurry for CMP is preferably from −10 to 10 mV, more preferably from −5 to 5 mV. The method for adjusting the zeta-potential of the abrasive particles is, for example, a method of adding an acid or the like to adjust the pH, or a method of adding a silane coupling agent or the like to modify the surface of the abrasive particles.

In the present invention, the zeta-potential is obtained by electrophoresis, and may be measured by use of a zeta-potential measuring device, ZETASIZER 3000HSA, manufactured by Malvern. The zeta-potential of the abrasive particles may be obtained by use of the measuring device about the polishing slurry of the present invention for CMP. In methods for measuring the zeta-potential of any wiring metal and that of any barrier metal, prepared is first a mixed liquid being the same in composition as the above-mentioned polishing slurry for CMP except that no abrasive particles are contained therein. To 100 parts by weight of the mixed liquid is added 1 part by weight of powder of the wiring metal or the barrier metal (specifically, Cu or TaN). The resultant is sufficiently stirred to prepare a sample. The measuring device is used to measure the zeta-potential thereof. The size of the powder of the wiring metal or the barrier metal does not affect the zeta-potential; however, the size may be appropriately decided in accordance with characteristics of the measuring device. For example, the following may be used: powdery particles that have passed through a 45-μm mesh, powdery particles that have passed through a 75-μm mesh, or powdery particles about 1 μm in particle diameter that have passed through a 150 (150 lines per inch) mesh. About the zeta-potential of each of the objects to be measured, a measurement thereof is made 5 times, and an average of the obtained values is used as the measured value.

The use of the polishing slurry of the present invention for CMP, which has been described above, makes it possible to polish a barrier layer made of a barrier metal such as TaN or Ta, a wiring metal layer, and an interlayer dielectric continuously, and prevent the interlayer dielectric in a region near the wiring metal layer from being excessively polished so as to restrain the generation of a depression such as a fang or a seam.

The polishing method of the invention contains a first chemical mechanical polishing step of preparing a substrate having an interlayer dielectric having a surface composed of concave regions and convex regions, a barrier layer for covering the interlayer dielectric along the surface thereof, and a wiring metal layer which is filled into the concave regions to cover the barrier layer, and polishing the wiring metal layer to expose the barrier layer on the convex regions, and a second chemical mechanical polishing step of to polishing the barrier layer of the substrate exposed in the first chemical mechanical polishing step using a polishing slurry of the present invention for CMP, thereby exposing the interlayer dielectric on the convex regions.

Examples of the wiring metal which constitutes the wiring metal layer include copper, copper alloy, oxides of copper, and oxides of copper alloy. The wiring metal layer may be a film wherein wiring is formed by a known sputtering or plating method.

The barrier layer is formed to prevent the wiring metal from diffusing into the interlayer dielectric, and improve the adhesive property between the interlayer dielectric and the wiring metal. The composition of the barrier layer is preferably selected from tungsten, tungsten compounds such as tungsten nitride and tungsten alloy, titanium, titanium compounds such as titanium nitride and titanium alloy, tantalum, tantalum compounds such as tantalum nitride and tantalum alloy, ruthenium, and ruthenium compounds, and is preferably tantalum or a tantalum compound. The barrier layer may be a mono-layered structure made of one of these materials, or a laminated structure made of two or more of the materials.

The interlayer dielectric is, for example, a silicon-based coating or an organic polymer film, and is preferably a silicon-based coating. The silicon-based coating may be a silica-based coating made of silicon dioxide, fluorosilicate glass, organosilicate glass made from trimethylsilane or dimethoxy dimethylsilane as a starting material, silicon oxynitride, or hydrogenated silsesquioxane; silicon carbide; or silicon nitride. The organic polymer film may be an entirely aromatic, low-dielectric-constant interlayer dielectric. These films may each be formed by CVD, spin coating, dip coating or spraying.

The method for the polishing in the chemical mechanical polishing steps may be a method of supplying a polishing slurry for CMP into a gap between a polishing pad of a polishing table and a substrate, which has a surface to be polished, in the state that the substrate is pressed onto the polishing pad while moving the polishing table and the substrate relatively. The polishing machine that can be used may be an ordinary polishing machine having a holder for holding the substrate, which has a film to be polished, and a polishing table which a polishing cloth (pad) can be attached onto and which is provided with a motor the rotation number of which can be varied, and so.

The polishing cloth on the polishing table may be an ordinary nonwoven cloth, polyurethane foam, porous fluorine-contained resin, or the like, and is not particularly limited. It is preferred to subject the polishing cloth to groove-working for causing the polishing slurry for CMP to be collected in grooves. Conditions for the polishing are not particularly limited. The rotational speed of the table is preferably a low rotational speed of 200 rpm or less in order for the semiconductor substrate not to spin out. The pressure (working load) applied to the semiconductor substrate is preferably 0.357 kg/cm$^2$ or less in order for injuries not to be generated after the polishing.

In order to move the polishing cloth and the film to be polished of the substrate relatively in the state that the film is pressed onto the polishing cloth, it suffices that, specifically, at least one of the substrate and the polishing table is moved. The polishing may be attained by rotating or swinging the holder besides rotating the polishing table. Additionally, the following methods are given: a polishing method wherein the polishing table is rotated planetwise, and a polishing method wherein a polishing cloth in a belt form is straightly moved in one out of longitudinal directions. The holder may be in the state of any one of fixation, rotation, and swing. As far as the polishing cloth and the film to be polished are relatively moved, an appropriate method may be selected from these polishing methods in accordance with the surface to be polished or the polishing machine.

While the polishing is performed, the polishing slurry of the present invention for CMP is continuously supplied into a gap between the polishing cloth and the film to be polished with a pump or the like. The supplying amount thereof is not particularly limited, and is preferably an amount which permits the surface of the polishing cloth to be constantly covered with the polishing slurry. Specifically, the slurry is supplied preferably in an amount of 0.005 to 0.40 mL per square centimeter of the area of the polishing cloth.

It is preferred to wash the polished semiconductor substrate sufficiently in flowing water, use a spin drier or the like after the washing so as to slide away water droplets adhering onto the semiconductor substrate, and then dry the substrate.

When the above-mentioned polishing method, wherein the polishing slurry of the present invention for CMP is used, is performed, the depression quantity of the interlayer dielectric in a region near the wiring metal layer, relative to the wiring metal layer, can be restrained into 20 nm or less.

EXAMPLES

The invention will be more specifically described by way of the following examples.

(1) Zeta-Potential Measurement

Measuring device: ZETASIZER 3000HSA (manufactured by Malvern)

Measuring method: a syringe is used to collect 5 mL of a sample, and the sample is injected into a measuring cell in the device through the syringe. The measuring temperature is set to 20° C., and water is used as a solvent species to make the measurement. The measurement is repeated 5 times, and the average value is used as the measured value.

(2) Measurement Conditions

Copper-wired substrates: S854's manufactured by Smatech was used. The copper film of each of the S854's was polished with HS-C430 manufactured by Hitachi Chemical Co., Ltd.

Polishing device: polishing device for CMP (MIRRA 3400, manufactured by Applied Materials, Inc.)

Polishing pad: foamed polyurethane resin having independent air foams

Polishing pressure: 140 gf/cm$^2$

Rotation number of the table: 93 rotations/minute

Rotation number of the head: 87 rotations/minute

Slurry flow rate: 200 mL/minute

Polishing period: the polishing period was set to make the polish amount of an interlayer dielectric field region into 70 nm.

(3) Method for Evaluating the Flatness of the Polished Products

Seam quantity: any one of the copper-wired substrates was used and polished, and in its stripe pattern region wherein wire metal regions 100 μm in width were arranged to be alternated with insulation film regions 100 μm in width, the depression quantity of the interlayer dielectric in a region near the wiring metal layer, relative to the wiring metal layer, was evaluated with a probe-type surface profiler.

Fang quantity: any one of the copper-wired substrates was used and polished, and in its stripe pattern region wherein wire metal regions 9 μm in width were arranged to be alternated with insulation film regions 1 μm in width, the depression quantity of the interlayer dielectric in a region near the wiring metal layer, relative to the wiring metal layer, was evaluated with the probe-type surface profiler.

Film thickness of the insulation film regions: any one of the copper-wired substrates was used and polished, and the film thickness of its field region without having any pattern was measured with an optical thickness meter.

The probe-type surface profiler used was a 200V-SI manufactured by Veeco, and the measurements were made under conditions that the load was 5 mg and the scanning speed was 100 μm/60-seconds.

Example 1

(1-1) Preparation and Evaluation of a Polishing Slurry (A)

The following were collected, and sufficiently stirred and mixed: 5.0 parts by weight of colloidal silica having an average secondary particle diameter of 30 nm; 5.0 parts by weight of colloidal silica having an average secondary particle diameter of 70 nm; 0.5 part by weight of a mixture of 2,2'-((4-methyl-1H-benzotriazole-1-yl)methyl imino) bisethanol and 2,2'((5-methyl-1H-benzotriazole-1-yl)methyl imino) bisethanol (a VERZONE TT-250A (product name) manufactured by Daiwa Kasei K.K. was used, the product being referred to as the "tolyltriazole compound A" hereinafter) as tolyltriazole compounds; 0.5 part by weight of citric acid; 0.1 part by weight of polyacrylic acid having a weight-average molecular weight of 59000; and 88.9 parts by weight of pure water. Next, this mixed solution and hydrogen peroxide (30% solution in water, extra pure reagent) were mixed at a ratio by weight of 100.0/0.3, so as to prepare a polishing slurry (A). The pH of the polishing slurry (A) was measured and found to be 2.7.

The colloidal silicas were produced by hydrolysis of tetraethoxysilane in an ammonia solution.

The zeta-potential of the colloidal silicas in the polishing slurry (A) was measured and found to be 1.5 mV.

The polishing slurry (A) was used to polish one of the copper-wired substrates. The polishing was performed to set the polish amount of its interlayer dielectric field region to 70 nm. As a result, the seam quantity was 0 nm, and the fang quantity was 0 nm. No depression was generated in the interlayer dielectric in a region near the wiring metal layer.

(1-2) Measurement of the Zeta-Potential of TaN Powder

Mixed were components having the same composition as the polishing slurry (A) in the item (1-1) except that 1.0 part by weight of TaN powder was used instead of the 5.0 parts by weight of the colloidal silica wherein the average secondary particle diameter was 30 nm and the 5.0 parts by weight of the colloidal silica wherein the average secondary particle diameter was 70 nm, and pure water was used in an amount of 97.9 parts by weight, so as to produce a sample ($A_{Ta}$). The zeta-potential of the TaN powder in the sample ($A_{Ta}$) was measured and found to be −25.4 mV.

(1-3) Measurement of the Zeta-Potential of Cu Powder

Mixed were components having the same composition as the polishing slurry (A) in the item (1-1) except that 1.0 part by weight of Cu powder was used instead of the 5.0 parts by weight of the colloidal silica wherein the average secondary particle diameter was 30 nm and the 5.0 parts by weight of the colloidal silica wherein the average secondary particle diameter was 70 nm, and pure water was used in an amount of 97.9 parts by weight, so as to produce a sample ($A_{Cu}$). The zeta-potential of the Cu powder in the sample ($A_{Cu}$) was measured and found to be −9.9 mV.

The TaN powder used was TaN powder TAI05PB manufactured by Kojundo Chemical laboratory Co., Ltd.

The Cu powder used was Cu powder CUE08PB manufactured by Kojundo Chemical laboratory Co., Ltd.

Example 2

(2-1) Preparation and Evaluation of a Polishing Slurry (B)

The same operation as in the item (1-1) of Example 1 was performed except that the ratio by weight of hydrogen peroxide was 0.9, so as to prepare a polishing slurry (B). The pH of the polishing slurry (B) was measured and found to be 2.7.

The zeta-potential of the colloidal silicas in the polishing slurry (B) was measured and found to be 2.2 mV.

The polishing slurry (B) was used to polish one of the copper-wired substrates. The polishing was performed to set the polish amount of its interlayer dielectric field region to 70 nm. As a result, the seam quantity was 0 nm, and the fang quantity was 0 nm. No depression was generated in the interlayer dielectric in a region near the wiring metal layer.

(2-2) Measurement of the Zeta-Potential of TaN Powder

The same operation as in the item (1-2) of Example 1 was performed except that the ratio by weight of hydrogen peroxide was 0.9, so as to prepare a sample ($B_{Ta}$). The zeta-potential of the TaN powder in the sample ($B_{Ta}$) was measured and found to be −27.7 mV.

(2-3) Measurement of the Zeta-Potential of Cu Powder

The same operation as in the item (1-3) of Example 1 was performed except that the ratio by weight of hydrogen peroxide was 0.9, so as to prepare a sample ($B_{Cu}$). The zeta-potential of the Cu powder in the sample ($B_{Cu}$) was measured and found to be −10.9 mV.

Example 3

(3-1) Preparation and Evaluation of a Polishing Slurry (C)

The following were collected, and sufficiently stirred and mixed: 10.0 parts by weight of colloidal silica having an average secondary particle diameter of 30 nm; 1.0 part by weight of the tolyltriazole compound A; 1.0 part by weight of malic acid; 10.0 parts by weight of propylene glycol monopropyl ether; 0.1 part by weight of polyacrylic acid; and 77.9 parts by weight of pure water. Next, this mixed solution and hydrogen peroxide (30% solution in water, extra pure reagent) were mixed at a ratio by weight of 100.0/0.3, so as to prepare a polishing slurry (C). The pH of the polishing slurry (C) was measured and found to be 2.8.

The zeta-potential of the colloidal silica in the polishing slurry (C) was measured and found to be 1.6 mV.

The polishing slurry (C) was used to polish one of the copper-wired substrates. The polishing was performed to set the polish amount of its interlayer dielectric field region to 70 nm. As a result, the seam quantity was 1 nm, and the fang quantity was 0 nm. No depression was generated in the interlayer dielectric in a region near the wiring metal layer.

(3-2) Measurement of the Zeta-Potential of TaN Powder

Mixed were components having the same composition as the polishing slurry (C) in the item (3-1) except that 1.0 part by weight of TaN powder was used instead of the 10.0 parts by weight of the colloidal silica wherein the average secondary particle diameter was 30 nm, and pure water was used in an amount of 86.9 parts by weight, so as to produce a sample ($C_{Ta}$). The zeta-potential of the TaN powder in the sample ($C_{Ta}$) was measured and found to be −26.3 mV.

(3-3) Measurement of the Zeta-Potential of Cu Powder

Mixed were components having the same composition as the polishing slurry (C) in the item (3-1) except that 1.0 part by weight of Cu powder was used instead of the 10.0 parts by weight of the colloidal silica wherein the average secondary particle diameter was 30 nm, and pure water was used in an amount of 86.9 parts by weight, so as to produce a sample ($C_{Cu}$). The zeta-potential of the Cu powder in the sample ($C_{Cu}$) was measured and found to be −7.9 mV.

Example 4

(4-1) Preparation and Evaluation of a Polishing Slurry (D)

The same operation as in the item (3-1) of Example 3 was performed except that the ratio by weight of hydrogen peroxide was 0.9, so as to prepare a polishing slurry (D). The pH of the polishing slurry (D) was measured and found to be 2.8.

The zeta-potential of the colloidal silica in the polishing slurry (D) was measured and found to be 1.7 mV.

The polishing slurry (D) was used to polish one of the copper-wired substrates. The polishing was performed to set the polish amount of its interlayer dielectric field region to 70 nm. As a result, the seam quantity was 1 nm, and the fang quantity was 1 nm. No depression was generated in the interlayer dielectric in a region near the wiring metal layer.

(4-2) Measurement of the Zeta-Potential of TaN Powder

The same operation as in the item (3-2) of Example 3 was performed except that the ratio by weight of hydrogen peroxide was 0.9, so as to prepare a sample ($D_{Ta}$). The zeta-potential of the TaN powder in the sample ($D_{Ta}$) was measured and found to be −26.5 mV.

(4-3) Measurement of the Zeta-Potential of Cu Powder

The same operation as in the item (3-3) of Example 3 was performed except that the ratio by weight of hydrogen peroxide was 0.9, so as to prepare a sample ($D_{Cu}$). The zeta-potential of the Cu powder in the sample ($D_{Cu}$) was measured and found to be −8.7 mV.

Example 5

(5-1) Preparation and Evaluation of a Polishing Slurry (E)

The following were collected, and sufficiently stirred and mixed: 5.0 parts by weight of colloidal silica having an average secondary particle diameter of 70 nm; 0.5 part by weight of the tolyltriazole compound A; 0.1 part by weight of 1,2,4-triazole; 0.5 part by weight of malic acid; 1.0 part by weight of methanol; and 92.9 parts by weight of pure water. Next, this mixed solution and hydrogen peroxide (30% solution in water, extra pure reagent) were mixed at a ratio by weight of 100.0/0.3, so as to prepare a polishing slurry (E). The pH of the polishing slurry (E) was measured and found to be 2.7.

The zeta-potential of the colloidal silica in the polishing slurry (E) was measured and found to be 2.1 mV.

The polishing slurry (E) was used to polish one of the copper-wired substrates. The polishing was performed to set the polish amount of its interlayer dielectric field region to 70 nm. As a result, the seam quantity was 1 nm, and the fang quantity was 0 nm. No depression was generated in the interlayer dielectric in a region near the wiring metal layer.

(5-2) Measurement of the Zeta-Potential of TaN Powder

Mixed were components having the same composition as the polishing slurry (E) in the item (5-1) except that 1.0 part by weight of TaN powder was used instead of the 5.0 parts by weight of the colloidal silica wherein the average secondary particle diameter was 70 nm, and pure water was used in an amount of 96.9 parts by weight, so as to produce a sample ($E_{Ta}$). The zeta-potential of the TaN powder in the sample ($E_{Ta}$) was measured and found to be −27.7 mV.

(5-3) Measurement of the Zeta-Potential of Cu Powder

Mixed were components having the same composition as the polishing slurry (E) in the item (5-1) except that 1.0 part by weight of Cu powder was used instead of the 5.0 parts by weight of the colloidal silica wherein the average secondary particle diameter was 70 nm, and pure water was used in an amount of 96.9 parts by weight, so as to produce a sample ($E_{Cu}$). The zeta-potential of the Cu powder in the sample ($E_{Cu}$) was measured and found to be −13.1 mV.

Example 6

(6-1) Preparation and Evaluation of a Polishing Slurry (F)

The same operation as in the item (5-1) of Example 5 was performed except that the ratio by weight of hydrogen peroxide was 0.9, so as to prepare a polishing slurry (F). The pH of the polishing slurry (F) was measured and found to be 2.8.

The zeta-potential of the colloidal silica in the polishing slurry (F) was measured and found to be 1.7 mV.

The polishing slurry (F) was used to polish one of the copper-wired substrates. The polishing was performed to set the polish amount of its interlayer dielectric field region to 70 nm. As a result, the seam quantity was 1 nm, and the fang quantity was 0 nm. No depression was generated in the interlayer dielectric in a region near the wiring metal layer.

(6-2) Measurement of the Zeta-Potential of TaN Powder

The same operation as in the item (5-2) of Example 5 was performed except that the ratio by weight of hydrogen peroxide was 0.9, so as to prepare a sample ($F_{Ta}$). The zeta-potential of the TaN powder in the sample ($F_{Ta}$) was measured and found to be −25.3 mV.

(6-3) Measurement of the Zeta-Potential of Cu Powder

The same operation as in the item (5-3) of Example 5 was performed except that the ratio by weight of hydrogen peroxide was 0.9, so as to prepare a sample ($F_{Cu}$). The zeta-potential of the Cu powder in the sample ($F_{Cu}$) was measured and found to be −7.7 mV.

Example 7

(7-1) Preparation and Evaluation of a Polishing Slurry (G)

The following were collected, and sufficiently stirred and mixed: 5.0 parts by weight of colloidal silica having an average secondary particle diameter of 30 nm; 0.2 part by weight of the tolyltriazole compound A; 0.1 part by weight of 7hydroxy-5-methyl-2,3a-triazopyrimidine; 0.2 part by weight of salicylic acid; 5.0 parts by weight of propylene glycol monopropyl ether; and 89.5 parts by weight of pure water. Next, this mixed solution and hydrogen peroxide (30% solution in water, extra pure reagent) were mixed at a ratio by weight of 100.0/0.3, so as to prepare a polishing slurry (G). The pH of the polishing slurry (G) was measured and found to be 2.7.

The zeta-potential of the colloidal silica in the polishing slurry (G) was measured and found to be 2.2 mV.

The polishing slurry (G) was used to polish one of the copper-wired substrates. The polishing was performed to set the polish amount of its interlayer dielectric field region to 70 nm. As a result, the seam quantity was 2 nm, and the fang quantity was 1 nm. No depression was generated in the interlayer dielectric in a region near the wiring metal layer.

(7-2) Measurement of the Zeta-Potential of TaN Powder

Mixed were components having the same composition as the polishing slurry (G) in the item (7-1) except that 1.0 part by weight of TaN powder was used instead of the 5.0 parts by weight of the colloidal silica wherein the average secondary particle diameter was 30 nm, and pure water was used in an amount of 94.5 parts by weight, so as to produce a sample ($G_{Ta}$). The zeta-potential of the TaN powder in the sample ($G_{Ta}$) was measured and found to be −27.0 mV.

(7-3) Measurement of the Zeta-Potential of Cu Powder

Mixed were components having the same composition as the polishing slurry (G) in the item (7-1) except that 1.0 part by weight of Cu powder was used instead of the 5.0 parts by weight of the colloidal silica wherein the average secondary particle diameter was 30 nm, and pure water was used in an amount of 94.5 parts by weight, so as to produce a sample ($G_{Cu}$). The zeta-potential of the Cu powder in the sample ($G_{Cu}$) was measured and found to be −9.9 mV.

Example 8

(8-1) Preparation and Evaluation of a Polishing Slurry (H)

The same operation as in the item (7-1) of Example 7 was performed except that the ratio by weight of hydrogen peroxide was 0.9, so as to prepare a polishing slurry (H). The pH of the polishing slurry (H) was measured and found to be 2.7

The zeta-potential of the colloidal silica in the polishing slurry (H) was measured and found to be 2.3 mV.

The polishing slurry (H) was used to polish one of the copper-wired substrates. The polishing was performed to set the polish amount of its interlayer dielectric field region to 70 nm. As a result, the seam quantity was 2 nm, and the fang quantity was 2 nm. No depression was generated in the interlayer dielectric in a region near the wiring metal layer.

(8-2) Measurement of the Zeta-Potential of TaN Powder

The same operation as in the item (7-2) of Example 7 was performed except that the ratio by weight of hydrogen peroxide was 0.9, so as to prepare a sample ($H_{Ta}$). The zeta-potential of the TaN powder in the sample ($H_{Ta}$) was measured and found to be −27.9 mV.

(8-3) Measurement of the Zeta-Potential of Cu Powder

The same operation as in the item (7-3) of Example 7 was performed except that the ratio by weight of hydrogen peroxide was 0.9, so as to prepare a sample ($H_{Cu}$). The zeta-potential of the Cu powder in the sample ($H_{Cu}$) was measured and found to be −11.0 mV.

Tables 1 and 2 show the compositions of the polishing slurries (A) to (H), the compositions of the samples ($A_{Ta}$) to ($H_{Ta}$), the compositions of the samples ($A_{Cu}$) to ($H_{Cu}$) of Examples 1 to 8, and evaluation results thereof.

TABLE 1

| | | Examples | | | | | | | | | | | |
|---|---|---|---|---|---|---|---|---|---|---|---|---|---|
| | | 1 | | | 2 | | | 3 | | | 4 | | |
| | Polishing slurry or sample | A | $A_{Ta}$ | $A_{Cu}$ | B | $B_{Ta}$ | $B_{Cu}$ | C | $C_{Ta}$ | $C_{Cu}$ | D | $D_{Ta}$ | $D_{Cu}$ |
| Abrasive particles | Colloidal silica (average secondary particle diameter: 30 nm) | 5 | | | 5 | | | 10 | | | 10 | | |
| | Colloidal silica (average secondary particle diameter: 70 nm) | 5 | | | 5 | | | | | | | | |
| Acid | Salicylic acid | | | | | | | | | | | | |
| | Malic acid | | | | | | | 1 | 1 | 1 | 1 | 1 | 1 |
| | Citric acid | 0.5 | 0.5 | 0.5 | 0.5 | 0.5 | 0.5 | | | | | | |
| Anticorrosive | Tolyltriazole compound A | 0.5 | 0.5 | 0.5 | 0.5 | 0.5 | 0.5 | 1 | 1 | 1 | 1 | 1 | 1 |
| | Benzotriazole | | | | | | | | | | | | |
| | 7hydroxy-5methyl-2,3a-triazopyrimidine | | | | | | | | | | | | |
| | 1,2,4-Triazole | | | | | | | | | | | | |
| Solvent | Propylene glycol monopropyl ether | | | | | | | 10 | 10 | 10 | 10 | 10 | 10 |
| | Methanol | | | | | | | | | | | | |
| | Polyacrylic acid | 0.1 | 0.1 | 0.1 | 0.1 | 0.1 | 0.1 | 0.1 | 0.1 | 0.1 | 0.1 | 0.1 | 0.1 |
| | Water | 88.9 | 97.9 | 97.9 | 88.9 | 97.9 | 97.9 | 77.9 | 86.9 | 86.9 | 77.9 | 86.9 | 86.9 |
| | Hydrogen peroxide | 0.3 | 0.3 | 0.3 | 0.9 | 0.9 | 0.9 | 0.3 | 0.3 | 0.3 | 0.9 | 0.9 | 0.9 |
| | pH of polishing slurry | 2.7 | | | 2.7 | | | 2.8 | | | 2.8 | | |
| | Ta powder | | 1.0 | | | 1.0 | | | 1.0 | | | 1.0 | |
| | Cu powder | | | 1.0 | | | 1.0 | | | 1.0 | | | 1.0 |
| Zeta-potential | Zeta-potential of silica | 1.5 | | | 2.2 | | | 1.6 | | | 1.7 | | |
| | Zeta-potential of TaN: A1 | | −25.4 | | | −27.7 | | | −26.3 | | | −26.5 | |
| | Zeta-potential of Cu: A2 | | | −9.9 | | | −10.9 | | | −7.9 | | | −8.7 |
| | Difference (absolute value) between A1 and A2 | 15.5 | | | 16.8 | | | 18.4 | | | 17.8 | | |
| Depression | Seam quantity (nm) | 0 | | | 0 | | | 1 | | | 1 | | |
| | Fang quantity (nm) | 0 | | | 0 | | | 0 | | | 1 | | |

TABLE 2

| | | Examples | | | | | | | | | | | |
|---|---|---|---|---|---|---|---|---|---|---|---|---|---|
| | | 5 | | | 6 | | | 7 | | | 8 | | |
| | Polishing slurry or sample | E | $E_{Ta}$ | $E_{Cu}$ | F | $F_{Ta}$ | $F_{Cu}$ | G | $G_{Ta}$ | $G_{Cu}$ | H | $H_{Ta}$ | $H_{Cu}$ |
| Abrasive particles | Colloidal silica (average secondary particle diameter: 30 nm) | | | | | | | 5 | | | 5 | | |
| | Colloidal silica (average secondary particle diameter: 70 nm) | 5 | | | 5 | | | | | | | | |
| Acid | Salicylic acid | | | | | | | 0.2 | 0.2 | 0.2 | 0.2 | 0.2 | 0.2 |
| | Malic acid | 0.5 | 0.5 | 0.5 | 0.5 | 0.5 | 0.5 | | | | | | |
| | Citric acid | | | | | | | | | | | | |
| Anticorrosive | Tolyltriazole compound A | 0.5 | 0.5 | 0.5 | 0.5 | 0.5 | 0.5 | 0.2 | 0.2 | 0.2 | 0.2 | 0.2 | 0.2 |
| | Benzotriazole | | | | | | | | | | | | |
| | 7hydroxy-5methyl-2,3a-triazopyrimidine | | | | | | | 0.1 | 0.1 | 0.1 | 0.1 | 0.1 | 0.1 |
| | 1,2,4-Triazole | 0.1 | 0.1 | 0.1 | 0.1 | 0.1 | 0.1 | | | | | | |

TABLE 2-continued

| | | Examples | | | | | | | | | | | | |
|---|---|---|---|---|---|---|---|---|---|---|---|---|---|---|
| | | 5 | | | 6 | | | 7 | | | 8 | | | |
| Solvent | Propylene glycol monopropyl ether | | | | | | | 5 | 5 | 5 | 5 | 5 | 5 | |
| | Methanol | 1 | 1 | 1 | 1 | 1 | 1 | | | | | | | |
| | Polyacrylic acid | | | | | | | | | | | | | |
| | Water | 92.9 | 96.9 | 96.9 | 92.9 | 96.9 | 96.9 | 89.5 | 94.5 | 94.5 | 89.5 | 94.5 | 94.5 | |
| | Hydrogen peroxide | 0.3 | 0.3 | 0.3 | 0.9 | 0.9 | 0.9 | 0.3 | 0.3 | 0.3 | 0.9 | 0.9 | 0.9 | |
| | pH of polishing slurry | 2.8 | | | 2.8 | | | 2.7 | | | 2.7 | | | |
| | Ta powder | | 1.0 | | | 1.0 | | | 1.0 | | | 1.0 | | |
| | Cu powder | | | 1.0 | | | 1.0 | | | 1.0 | | | 1.0 | |
| Zeta-potential | Zeta-potential of silica | 2.1 | | | 1.7 | | | 2.2 | | | 2.3 | | | |
| | Zeta-potential of TaN: A1 | | −27.7 | | | −25.3 | | | −27 | | | −27.9 | | |
| | Zeta-potential of Cu: A2 | | | −13.1 | | | −7.7 | | | −9.9 | | | −11 | |
| | Difference (absolute value) between A1 and A2 | | 14.6 | | | 17.6 | | | 17.1 | | | 16.9 | | |
| Depression | Seam quantity (nm) | 1 | | | 1 | | | 2 | | | 2 | | | |
| | Fang quantity (nm) | 0 | | | 0 | | | 1 | | | 2 | | | |

Comparative Example 1

(9-1) Preparation and Evaluation of a Polishing Slurry (I)

The following were collected, and sufficiently stirred and mixed: 5.0 parts by weight of colloidal silica having an average secondary particle diameter of 30 nm; 5.0 parts by weight of colloidal silica having an average secondary particle diameter of 70 nm; 0.2 part by weight of benzotriazole; 0.5 part by weight of citric acid; 0.1 part by weight of polyacrylic acid; and 89.2 parts by weight of pure water. Next, this mixed solution and hydrogen peroxide (30% solution in water, extra pure reagent) were mixed at a ratio by weight of 100.0/0.3, so as to prepare a polishing slurry (I). The pH of the polishing slurry (I) was measured and found to be 2.7.

The zeta-potential of the colloidal silica in the polishing slurry (I) was measured and found to be −1.0 mV.

The polishing slurry (I) was used to polish one of the copper-wired substrates. The polishing was performed to set the polish amount of its interlayer dielectric field region to 70 nm. As a result, the seam quantity was 53 nm, and the fang quantity was 45 nm. A deep depression was generated in the interlayer dielectric in a region near the wiring metal layer.

(9-2) Measurement of the Zeta-Potential of TaN Powder

Mixed were components having the same composition as the polishing slurry (I) in the item (9-1) except that 1.0 part by weight of TaN powder was used instead of the 5.0 parts by weight of the colloidal silica wherein the average secondary particle diameter was 30 nm and the 5.0 parts by weight of the colloidal silica wherein the average secondary particle diameter was 70 nm, and pure water was used in an amount of 98.2 parts by weight, so as to produce a sample ($I_{Ta}$) The zeta-potential of the TaN powder in the sample ($I_{Ta}$) was measured and found to be −29.4 mV.

(9-3) Measurement of the Zeta-Potential of Cu Powder

Mixed were components having the same composition as the polishing slurry (I) in the item (9-1) except that 1.0 part by weight of Cu powder was used instead of the 5.0 parts by weight of the colloidal silica wherein the average secondary particle diameter was 30 nm and the 5.0 parts by weight of the colloidal silica wherein the average secondary particle diameter was 70 nm, and pure water was used in an amount of 98.2 parts by weight, so as to produce a sample ($I_{Cu}$). The zeta-potential of the Cu powder in the sample ($I_{Cu}$) was measured and found to be 16.2 mV.

Comparative Example 2

(10-1) Preparation and Evaluation of a Polishing Slurry (J)

The same operation as in the item (9-1) of Comparative Example 1 was performed except that the ratio by weight of hydrogen peroxide was 0.9, so as to prepare a polishing slurry (J). The pH of the polishing slurry (J) was measured and found to be 2.7.

The zeta-potential of the colloidal silica in the polishing slurry (J) was measured and found to be −1.3 mV.

The polishing slurry (J) was used to polish one of the copper-wired substrates. The polishing was performed to set the polish amount of its interlayer dielectric field region to 70 nm. As a result, the seam quantity was 60 nm, and the fang quantity was 50 nm. A deep depression was generated in the interlayer dielectric in a region near the wiring metal layer.

(10-2) Measurement of the Zeta-Potential of TaN Powder

The same operation as in the item (9-2) of Comparative Example 1 was performed except that the ratio by weight of hydrogen peroxide was 0.9, so as to prepare a sample ($J_{Ta}$). The zeta-potential of the TaN powder in the sample ($J_{Ta}$) was measured and found to be −28.9 mV.

(10-3) Measurement of the Zeta-Potential of Cu Powder

The same operation as in the item (9-3) of Comparative Example 1 was performed except that the ratio by weight of hydrogen peroxide was 0.9, so as to prepare a sample ($J_{Cu}$). The zeta-potential of the Cu powder in the sample ($J_{Cu}$) was measured and found to be 15.9 mV.

Comparative Example 3

(11-1) Preparation and Evaluation of a Polishing Slurry (K)

The following were collected, and sufficiently stirred and mixed: 10.0 parts by weight of colloidal silica having an average secondary particle diameter of 30 nm; 0.2 part by weight of benzotriazole; 1.0 part by weight of malic acid; 10.0 parts by weight of propylene glycol monopropyl ether; 0.1 part by weight of polyacrylic acid; and 78.7 parts by weight of pure water. Next, this mixed solution and hydrogen peroxide (30% solution in water, extra pure reagent) were mixed at a ratio by weight of 100.0/0.3, so as to prepare a polishing slurry (K). The pH of the polishing slurry (K) was measured and found to be 2.7.

The zeta-potential of the colloidal silica in the polishing slurry (K) was measured and found to be 1.6 mV.

The polishing slurry (K) was used to polish one of the copper-wired substrates. The polishing was performed to set the polish amount of its interlayer dielectric field region to 70 nm. As a result, the seam quantity was 66 nm, and the fang quantity was 53 nm. A deep depression was generated in the interlayer dielectric in a region near the wiring metal layer.

(11-2) Measurement of the Zeta-Potential of TaN Powder

Mixed were components having the same composition as the polishing slurry (K) in the item (11-1) except that 1.0 part by weight of TaN powder was used instead of the 10.0 parts by weight of the colloidal silica wherein the average secondary particle diameter was 30 nm, and pure water was used in an amount of 87.7 parts by weight, so as to produce a sample ($K_{Ta}$). The zeta-potential of the TaN powder in the sample ($K_{Ta}$) was measured and found to be −19.6 mV.

(11-3) Measurement of the Zeta-Potential of Cu Powder

Mixed were components having the same composition as the polishing slurry (K) in the item (11-1) except that 1.0 part by weight of Cu powder was used instead of the 10.0 parts by weight of the colloidal silica wherein the average secondary particle diameter was 30 nm, and pure water was used in an amount of 87.7 parts by weight, so as to produce a sample ($K_{Cu}$). The zeta-potential of the Cu powder in the sample ($K_{Cu}$) was measured and found to be 2.7 mV.

Comparative Example 4

(12-1) Preparation and Evaluation of a Polishing Slurry (L)

The same operation as in the item (11-1) of Comparative Example 3 was performed except that the ratio by weight of hydrogen peroxide was 0.9, so as to prepare a polishing slurry (L). The pH of the polishing slurry (L) was measured and found to be 2.7.

The zeta-potential of the colloidal silica in the polishing slurry (L) was measured and found to be 1.4 mV.

The polishing slurry (L) was used to polish one of the copper-wired substrates. The polishing was performed to set the polish amount of its interlayer dielectric field region to 70 nm. As a result, the seam quantity was 59 nm, and the fang quantity was 53 nm. A deep depression was generated in the interlayer dielectric in a region near the wiring metal layer.

(12-2) Measurement of the Zeta-Potential of TaN Powder

The same operation as in the item (11-2) of Comparative Example 3 was performed except that the ratio by weight of hydrogen peroxide was 0.9, so as to prepare a sample ($L_{Ta}$).

The zeta-potential of the TaN powder in the sample ($L_{Ta}$) was measured and found to be −20.6 mV.

(12-3) Measurement of the Zeta-Potential of Cu Powder

The same operation as in the item (11-3) of Comparative Example 3 was performed except that the ratio by weight of hydrogen peroxide was 0.9, so as to prepare a sample ($L_{Cu}$). The zeta-potential of the Cu powder in the sample ($L_{Cu}$) was measured and found to be 2.1 mV.

Comparative Example 5

(13-1) Preparation and Evaluation of a Polishing Slurry (M)

The following were collected, and sufficiently stirred and mixed: 5.0 parts by weight of colloidal silica having an average secondary particle diameter of 70 nm; 0.2 part by weight of benzotriazole; 0.1 part by weight of 1,2,4-triazole; 0.5 part by weight of malic acid; 1.0 part by weight of methanol; and 93.2 parts by weight of pure water. Next, this mixed solution and hydrogen peroxide (30% solution in water, extra pure reagent) were mixed at a ratio by weight of 100.0/0.3, so as to prepare a polishing slurry (M). The pH of the polishing slurry (M) was measured and found to be 2.8.

The zeta-potential of the colloidal silica in the polishing slurry (M) was measured and found to be −0.2 mV.

The polishing slurry (M) was used to polish one of the copper-wired substrates. The polishing was performed to set the polish amount of its interlayer dielectric field region to 70 nm. As a result, the seam quantity was 55 nm, and the fang quantity was 50 nm. A deep depression was generated in the interlayer dielectric in a region near the wiring metal layer.

(13-2) Measurement of the Zeta-Potential of TaN Powder

Mixed were components having the same composition as the polishing slurry (M) in the item (13-1) except that 1.0 part by weight of TaN powder was used instead of the 5.0 parts by weight of the colloidal silica wherein the average secondary particle diameter was 70 nm, and pure water was used in an amount of 97.2 parts by weight, so as to produce a sample ($M_{Ta}$). The zeta-potential of the TaN powder in the sample ($M_{Ta}$) was measured and found to be −38.6 mV.

(13-3) Measurement of the Zeta-Potential of Cu Powder

Mixed were components having the same composition as the polishing slurry (M) in the item (13-1) except that 1.0 part by weight of Cu powder was used instead of the 5.0 parts by weight of the colloidal silica wherein the average secondary particle diameter was 70 nm, and pure water was used in an amount of 97.2 parts by weight, so as to produce a sample ($M_{Cu}$). The zeta-potential of the Cu powder in the sample ($M_{Cu}$) was measured and found to be 20.1 mV.

Comparative Example 6

(14-1) Preparation and Evaluation of a Polishing Slurry (N)

The same operation as in the item (13-1) of Comparative Example 5 was performed except that the ratio by weight of hydrogen peroxide was 0.9, so as to prepare a polishing slurry (N). The pH of the polishing slurry (N) was measured and found to be 2.8.

The zeta-potential of the colloidal silica in the polishing slurry (N) was measured and found to be 0.0 mV.

The polishing slurry (N) was used to polish one of the copper-wired substrates. The polishing was performed to set the polish amount of its interlayer dielectric field region to 70 nm. As a result, the seam quantity was 53 nm, and the fang quantity was 47 nm. A deep depression was generated in the interlayer dielectric in a region near the wiring metal layer.

(14-2) Measurement of the Zeta-Potential of TaN Powder

The same operation as in the item (13-2) of Comparative Example 5 was performed except that the ratio by weight of hydrogen peroxide was 0.9, so as to prepare a sample ($N_{Ta}$). The zeta-potential of the TaN powder in the sample ($N_{Ta}$) was measured and found to be −38.1 mV.

(14-3) Measurement of the Zeta-Potential of Cu Powder

The same operation as in the item (13-3) of Comparative Example 5 was performed except that the ratio by weight of hydrogen peroxide was 0.9, so as to prepare a sample ($N_{Cu}$). The zeta-potential of the Cu powder in the sample ($N_{Cu}$) was measured and found to be 12.0 mV.

Comparative Example 7

(15-1) Preparation and Evaluation of a Polishing Slurry (O)

The following were collected, and sufficiently stirred and mixed: 5.0 parts by weight of colloidal silica having an average secondary particle diameter of 30 nm; 0.1 part by weight of benzotriazole; 0.1 part by weight of 7hydroxy-5-methyl-2,3a-triazopyrimidine; 0.2 part by weight of salicylic acid; 5.0 parts by weight of propylene glycol monopropyl ether; and 89.6 parts by weight of pure water. Next, this mixed solution and hydrogen peroxide (30% solution in water, extra pure reagent) were mixed at a ratio by weight of 100.0/0.3, so as to prepare a polishing slurry (O). The pH of the polishing slurry (O) was measured and found to be 2.7.

The zeta-potential of the colloidal silica in the polishing slurry (O) was measured and found to be 2.1 mV.

The polishing slurry (O) was used to polish one of the copper-wired substrates. The polishing was performed to set the polish amount of its interlayer dielectric field region to 70 nm. As a result, the seam quantity was 71 nm, and the fang quantity was 66 nm. A deep depression was generated in the interlayer dielectric in a region near the wiring metal layer.

(15-2) Measurement of the Zeta-Potential of TaN Powder

Mixed were components having the same composition as the polishing slurry (O) in the item (15-1) except that 1.0 part by weight of TaN powder was used instead of the 5.0 parts by weight of the colloidal silica wherein the average secondary particle diameter was 30 nm, and pure water was used in an amount of 93.6 parts by weight, so as to produce a sample ($O_{Ta}$). The zeta-potential of the TaN powder in the sample ($O_{Ta}$) was measured and found to be −18.9 mV.

(15-3) Measurement of the Zeta-Potential of Cu Powder

Mixed were components having the same composition as the polishing slurry (O) in the item (15-1) except that 1.0 part by weight of Cu powder was used instead of the 5.0 parts by weight of the colloidal silica wherein the average secondary particle diameter was 30 nm, and pure water was used in an amount of 93.6 parts by weight, so as to produce a sample ($O_{Cu}$). The zeta-potential of the Cu powder in the sample ($O_{Cu}$) was measured and found to be 1.7 mV.

Comparative Example 8

(16-1) Preparation and Evaluation of a Polishing Slurry (P)

The same operation as in the item (15-1) of Comparative Example 7 was performed except that the ratio by weight of hydrogen peroxide was 0.9, so as to prepare a polishing slurry (P). The pH of the polishing slurry (P) was measured and found to be 2.7.

The zeta-potential of the colloidal silica in the polishing slurry (P) was measured and found to be 0.2 mV.

The polishing slurry (P) was used to polish one of the copper-wired substrates. The polishing was performed to set the polish amount of its interlayer dielectric field region to 70 nm. As a result, the seam quantity was 70 nm, and the fang quantity was 60 nm. A deep depression was generated in the interlayer dielectric in a region near the wiring metal layer.

(16-2) Measurement of the Zeta-Potential of TaN Powder

The same operation as in the item (15-2) of Comparative Example 7 was performed except that the ratio by weight of hydrogen peroxide was 0.9, so as to prepare a sample ($P_{Ta}$). The zeta-potential of the TaN powder in the sample ($P_{Ta}$) was measured and found to be −20.6 mV.

(16-3) Measurement of the Zeta-Potential of Cu Powder

The same operation as in the item (15-3) of Comparative Example 7 was performed except that the ratio by weight of hydrogen peroxide was 0.9, so as to prepare a sample ($P_{Cu}$) The zeta-potential of the Cu powder in the sample ($P_{Cu}$) was measured and found to be 3.5 mV.

Tables 3 and 4 show the compositions of the polishing slurries (I) to (P), the compositions of the samples ($I_{Ta}$) to ($P_{Ta}$), the compositions of the samples ($I_{cu}$) to ($P_{Cu}$) of Comparative Examples 1 to 8, and evaluation results thereof.

TABLE 3

| | | | Comparative Examples | | | | | | | | | | |
|---|---|---|---|---|---|---|---|---|---|---|---|---|---|
| | | | 1 | | | 2 | | | 3 | | | 4 | | |
| | Polishing slurry or sample | | I | $I_{Ta}$ | $I_{Cu}$ | J | $J_{Ta}$ | $J_{Cu}$ | K | $K_{Ta}$ | $K_{Cu}$ | L | $L_{Ta}$ | $L_{Cu}$ |
| Abrasive particles | Colloidal silica (average secondary particle diameter: 30 nm) | | 5 | | | 5 | | | 10 | | | 10 | | |

TABLE 3-continued

|  |  | Comparative Examples | | | | | | | | | | | |
|---|---|---|---|---|---|---|---|---|---|---|---|---|---|
|  |  | 1 | | | 2 | | | 3 | | | 4 | | |
|  | Colloidal silica (average secondary particle diameter: 70 nm) | 5 | | | 5 | | | | | | | | |
| Acid | Salicylic acid | | | | | | | | | | | | |
|  | Malic acid | | | | | | | 1 | 1 | 1 | 1 | 1 | 1 |
|  | Citric acid | 0.5 | 0.5 | 0.5 | 0.5 | 0.5 | 0.5 | | | | | | |
|  | Tolyltriazole compound A | | | | | | | | | | | | |
| Anticorrosive | Benzotriazole | 0.2 | 0.2 | 0.2 | 0.2 | 0.2 | 0.2 | 0.2 | 0.2 | 0.2 | 0.2 | 0.2 | 0.2 |
|  | 7hydroxy-5methyl-2,3a-triazopyrimidine | | | | | | | | | | | | |
|  | 1,2,4-Triazole | | | | | | | | | | | | |
| Solvent | Propylene glycol monopropyl ether | | | | | | | 10 | 10 | 10 | 10 | 10 | 10 |
|  | Methanol | | | | | | | | | | | | |
|  | Polyacrylic acid | 0.1 | 0.1 | 0.1 | 0.1 | 0.1 | 0.1 | 0.1 | 0.1 | 0.1 | 0.1 | 0.1 | 0.1 |
|  | Water | 89.2 | 98.2 | 98.2 | 89.2 | 98.2 | 98.2 | 78.7 | 87.7 | 87.7 | 78.7 | 87.7 | 87.7 |
|  | Hydrogen peroxide | 0.3 | 0.3 | 0.3 | 0.9 | 0.9 | 0.9 | 0.3 | 0.3 | 0.3 | 0.9 | 0.9 | 0.9 |
|  | pH of polishing slurry | 2.7 | | | 2.7 | | | 2.8 | | | 2.8 | | |
|  | Ta powder | | 1.0 | | | 1.0 | | | 1.0 | | | 1.0 | |
|  | Cu powder | | | 1.0 | | | 1.0 | | | 1.0 | | | 1.0 |
| Zeta-potential | Zeta-potential of silica | −1 | | | −1.3 | | | 1.6 | | | 1.4 | | |
|  | Zeta-potential of TaN: A1 | | −29.4 | | | −28.9 | | | −19.6 | | | −20.6 | |
|  | Zeta-potential of Cu: A2 | | | 16.2 | | | 15.9 | | | 2.7 | | | 2.1 |
|  | Difference (absolute value) between A1 and A2 | 45.6 | | | 44.8 | | | 22.3 | | | 22.7 | | |
| Depression | Seam quantity (nm) | 53 | | | 60 | | | 66 | | | 59 | | |
|  | Fang quantity (nm) | 45 | | | 50 | | | 53 | | | 53 | | |

TABLE 4

|  |  | Comparative Examples | | | | | | | | | | | |
|---|---|---|---|---|---|---|---|---|---|---|---|---|---|
|  |  | 5 | | | 6 | | | 7 | | | 8 | | |
|  | Polishing slurry or sample | M | $M_{Ta}$ | $M_{Cu}$ | N | $N_{Ta}$ | $N_{Cu}$ | O | $O_{Ta}$ | $O_{Cu}$ | P | $P_{Ta}$ | $P_{Cu}$ |
| Abrasive particles | Colloidal silica (average secondary particle diameter: 30 nm) | | | | | | | 5 | | | 5 | | |
|  | Colloidal silica (average secondary particle diameter: 70 nm) | 5 | | | 5 | | | | | | | | |
| Acid | Salicylic acid | | | | | | | 0.2 | 0.2 | 0.2 | 0.2 | 0.2 | 0.2 |
|  | Malic acid | 0.5 | 0.5 | 0.5 | 0.5 | 0.5 | 0.5 | | | | | | |
|  | Citric acid | | | | | | | | | | | | |
|  | Tolyltriazole compound A | | | | | | | | | | | | |
| Anticorrosive | Benzotriazole | 0.2 | 0.2 | 0.2 | 0.2 | 0.2 | 0.2 | 0.1 | 0.1 | 0.1 | 0.1 | 0.1 | 0.1 |
|  | 7hydroxy-5methyl-2,3a-triazopyrimidine | | | | | | | 0.1 | 0.1 | 0.1 | 0.1 | 0.1 | 0.1 |
|  | 1,2,4-Triazole | 0.1 | 0.1 | 0.1 | 0.1 | 0.1 | 0.1 | | | | | | |
| Solvent | Propylene glycol monopropyl ether | | | | | | | 5 | 5 | 5 | 5 | 5 | 5 |
|  | Methanol | 1 | 1 | 1 | 1 | 1 | 1 | | | | | | |
|  | Polyacrylic acid | | | | | | | | | | | | |
|  | Water | 93.2 | 97.2 | 97.2 | 93.2 | 97.2 | 97.2 | 89.6 | 93.6 | 93.6 | 89.6 | 93.6 | 93.6 |
|  | Hydrogen peroxide | 0.3 | 0.3 | 0.3 | 0.9 | 0.9 | 0.9 | 0.3 | 0.3 | 0.3 | 0.9 | 0.9 | 0.9 |
|  | pH of polishing slurry | 2.8 | | | 2.8 | | | 2.7 | | | 2.7 | | |
|  | Ta powder | | 1.0 | | | 1.0 | | | 1.0 | | | 1.0 | |
|  | Cu powder | | | 1.0 | | | 1.0 | | | 1.0 | | | 1.0 |
| Zeta-potential | Zeta-potential of silica | −0.2 | | | 0 | | | 2.1 | | | 0.2 | | |
|  | Zeta-potential of TaN: A1 | | −38.6 | | | −38.1 | | | −18.9 | | | −20.6 | |
|  | Zeta-potential of Cu: A2 | | | 20.1 | | | 12 | | | 1.7 | | | 3.5 |
|  | Difference (absolute value) between A1 and A2 | 58.7 | | | 50.1 | | | 20.6 | | | 24.1 | | |
| Depression | Seam quantity (nm) | 55 | | | 53 | | | 71 | | | 70 | | |
|  | Fang quantity (nm) | 50 | | | 47 | | | 66 | | | 60 | | |

It is understood that the polishing slurries of Examples 1 to 8 each make it possible to polish TaN and SiO$_2$ of the substrate continuously, and each give a smaller depression quantity so as to be better than the polishing slurries of Comparative Examples 1 to 8.

The invention claimed is:

1. A polishing slurry for CMP, containing abrasive particles, an acid, a tolyltriazole compound represented by the following general formula (I), and water:

[Formula 1]

wherein R$^1$s each independently represent an alkylene group having 1 to 4 carbon atoms, and R$^2$ represents an alkylene group having 1 to 4 carbon atoms,
wherein the difference (absolute value) between the zeta-potential of Cu in the polishing slurry for CMP except that no abrasive particles are contained therein, and that of TaN in the polishing slurry for CMP except that no abrasive particles are contained therein, is 20.0 mV or less, and
wherein the polishing slurry has a pH of 2 to 3.

2. The polishing slurry for CMP according to claim 1, wherein R$^2$ in the general formula (I) is a methylene group.

3. The polishing slurry for CMP according to claim 1, wherein R$^1$s in the general formula (I) are each a methylene group or an ethylene group.

4. The polishing slurry for CMP according to claim 1, wherein the tolyltriazole compound is 2,2'-((4-methyl-1H-benzotriazole-1-yl)methyl imino) bisethanol, 2,2'-((5-methyl-1H-benzotriazole-1-yl)methyl imino) bisethanol, or a mixture thereof.

5. The polishing slurry for CMP according to claim 1, wherein the abrasive particles are colloidal silica.

6. The polishing slurry for CMP according to claim 1, which contains an oxidizer for metal.

7. The polishing slurry for CMP according to claim 1, wherein the polishing slurry is capable of polishing exposed portions of a barrier layer provided between an insulating layer and a metal wiring layer, and the polishing slurry, containing said tolyltriazole compound represented by the general formula (I), has a property that it can be used to polish said barrier layer while restraining formation of a depression in the insulating layer alongside the barrier layer.

8. The polishing slurry for CMP according to claim 1, wherein said difference (absolute value) is in a range of 0.0 to 19.0 mV.

9. The polishing slurry for CMP according to claim 1, wherein a zeta-potential of Cu in the polishing slurry is a negative value.

10. The polishing slurry for CMP according to claim 1, wherein a zeta-potential of TaN in the polishing slurry is 19 mV or less.

11. The polishing slurry for CMP according to claim 1, wherein the abrasive particles in the polishing slurry for CMP have a zeta-potential of approximately 0 mV.

12. The polishing slurry for CMP according to claim 1, wherein the abrasive particles are made of silica, and have a zeta-potential of from −10 to 10 mV.

13. The polishing slurry for CMP according to claim 1, wherein a blend amount of said tolyltriazole compound represented by the general formula (I) in the polishing slurry is 0.0001 to 0.05 mol per 100 g of the polishing slurry.

14. The polishing slurry for CMP according to claim 13, wherein said blend amount is 0.0005 to 0.005 mol per 100 g of the polishing slurry.

15. A polishing method, comprising:
a first chemical mechanical polishing step of preparing a substrate having an interlayer dielectric having a surface composed of concave regions and convex regions, a barrier layer for covering the interlayer dielectric along the surface thereof, and a wiring metal layer which is filled into the concave regions to cover the barrier layer, and polishing the wiring metal layer to expose the barrier layer on the convex regions, and
a second chemical mechanical polishing step of polishing the barrier layer of the substrate exposed in the first chemical mechanical polishing step using a polishing slurry for CMP as recited in claim 1, thereby exposing the interlayer dielectric on the convex regions.

16. The polishing method according to claim 15, wherein the interlayer dielectric is a silicon-based coating film.

17. The polishing method according to claim 15, wherein wiring metal is at least one selected from the group consisting of copper, copper alloy, oxides of copper, and oxides of copper alloy.

18. The polishing method according to claim 15, wherein the barrier layer comprises a tantalum or a tantalum compound.

* * * * *